United States Patent
Donohoe et al.

(10) Patent No.: US 6,784,111 B2
(45) Date of Patent: Aug. 31, 2004

(54) ETCHING METHODS AND APPARATUS AND SUBSTRATE ASSEMBLIES PRODUCED THEREWITH

(75) Inventors: Kevin G. Donohoe, Boise, ID (US); Rich Stocks, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 174 days.

(21) Appl. No.: 09/916,734

(22) Filed: Jul. 26, 2001

(65) Prior Publication Data

US 2002/0000422 A1 Jan. 3, 2002

Related U.S. Application Data

(62) Division of application No. 09/342,677, filed on Jun. 29, 1999, now Pat. No. 6,635,335.

(51) Int. Cl.[7] .............................................. H02L 3/11
(52) U.S. Cl. ..................... 438/710; 438/689; 438/709
(58) Field of Search ................ 438/695, 702, 438/723, 743

(56) References Cited

U.S. PATENT DOCUMENTS

| | | | |
|---|---|---|---|
| 4,255,230 A | 3/1981 | Zajac | |
| 4,473,435 A | 9/1984 | Zafiropoulo et al. | |
| 4,612,085 A | 9/1986 | Jelks et al. | |
| 4,717,448 A | 1/1988 | Cox et al. | |
| 4,992,136 A | * 2/1991 | Tachi et al. | 438/695 |
| 5,310,454 A | * 5/1994 | Ohiwa et al. | 438/723 |
| 5,562,801 A | * 10/1996 | Nulty | 438/695 |
| 5,843,820 A | 12/1998 | Lu | |
| 6,074,954 A | 6/2000 | Lill et al. | |
| 6,074,957 A | * 6/2000 | Donohoe et al. | 438/723 |
| 6,093,655 A | * 7/2000 | Donohoe et al. | 438/694 |
| 6,117,786 A | * 9/2000 | Khajehnouri et al. | 438/723 |
| 6,123,862 A | * 9/2000 | Donohoe et al. | 438/723 |
| 6,136,722 A | * 10/2000 | Nambu | 438/723 |
| 6,342,165 B1 | * 1/2002 | Donohoe et al. | 438/723 |
| 6,362,109 B1 | * 3/2002 | Kim et al. | 438/706 |
| 6,451,705 B1 | * 9/2002 | Trapp et al. | 438/723 |

FOREIGN PATENT DOCUMENTS

JP 408203847 A 8/1996

\* cited by examiner

*Primary Examiner*—Felisa Hiteshew
(74) *Attorney, Agent, or Firm*—Klarquist Sparkman, LLP

(57) ABSTRACT

Methods and apparatus for etching substrates such as silicon wafers are provided. In one specific approach, a surface of the substrate assembly is covered with a resist that is patterned to define features to be etched. In this approach, the surface is then exposed to a plasma in a plasma etcher so that surface areas not covered with the resist are etched, while the thickness of the resist increases or etches at a rate that is at least ten times slower than that of the exposed areas of the surface. This etching process can be followed with a conventional plasma etch. By combining the etching that increases the resist thickness with the conventional etching of resist in which the resist thins during etching, features having high aspect ratios can be etched.

23 Claims, 3 Drawing Sheets

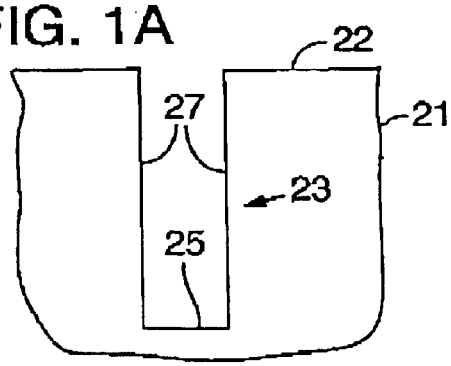
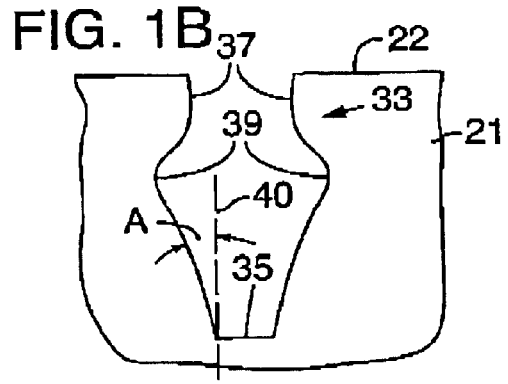
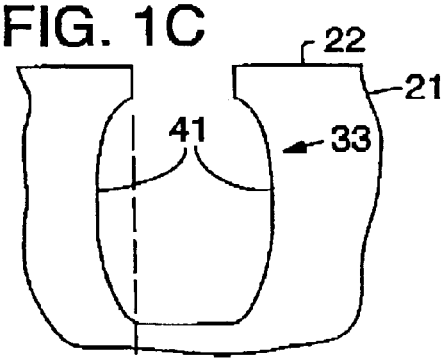
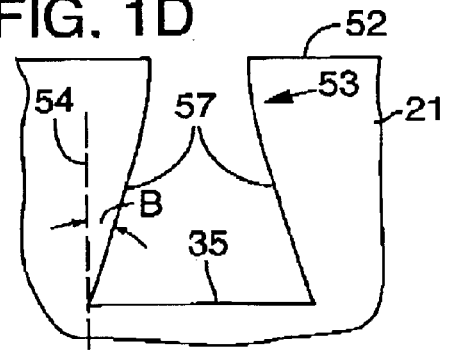
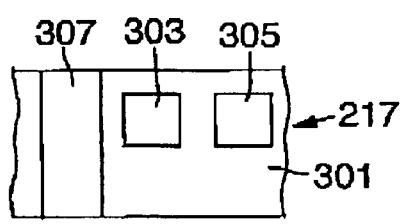
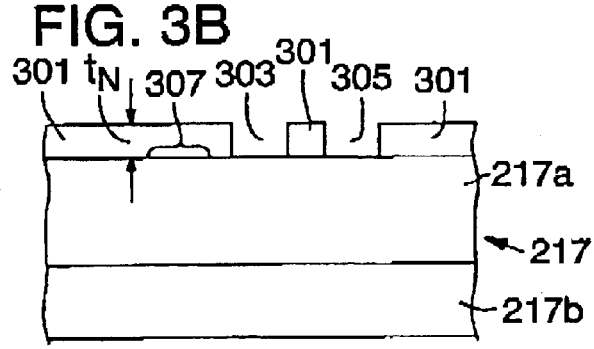
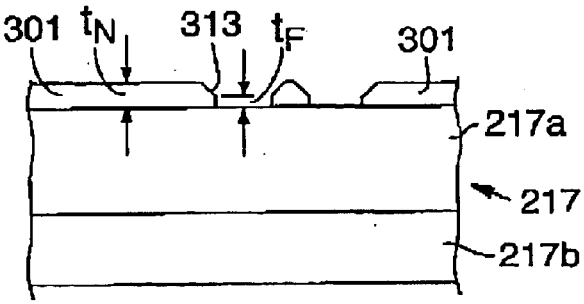

ETCHING METHODS AND APPARATUS AND SUBSTRATE ASSEMBLIES PRODUCED THEREWITH

This application is a division of application Ser. No. 09/342,677, now U.S. Pat. No. 6,635,335 filed Jun. 29, 1999.

TECHNICAL FIELD

The invention pertains to methods and apparatus for etching silicon wafers or other substrate assemblies and to substrate assemblies.

BACKGROUND OF THE INVENTION

The fabrication of very large scale integrated circuits requires processes that are compatible with small feature sizes (e.g. 0.25 $\mu$m). A particular problem is the etching of a silicon wafer or other substrate assembly to produce damascene layers, self-aligned contacts (SACs), or trench isolation. These features typically require etching relatively deeply into the wafer while maintaining a small footprint on the surface of the substrate assembly, i.e., these features have a high aspect ratio (HAR), with a depth to width (on the surface of the substrate assembly) ratio of 4:1 or larger.

Features to be etched into a substrate assembly are typically defined with a layer of photoresist that is spin-coated or otherwise applied onto a surface of the substrate assembly and then photolithographically patterned. After patterning, some areas of the substrate assembly surface remain covered by the photoresist layer while other areas are exposed. The covered substrate assembly is exposed to an etch and the photoresist layer prevents etching except in the exposed areas.

Etching of HAR features requires anisotropic etches that etch more rapidly in one direction than another. Conventional wet etches include dilute solutions of acids such as hydrofluoric acid. While wet etching is simple and inexpensive, wet etching is generally inadequate to produce HAR features because wet etches tend to etch isotropically. In addition, it is difficult to etch deep HAR features into a substrate assembly because the etchant does not flow freely into and out of the feature. Therefore, even if a wet etch begins to etch properly, etchant is consumed within the feature being etched and is replenished slowly.

Dry etching with plasmas is also used for etching substrate assemblies. In plasma etching, a gas or gas mixture is fragmented and ionized and the ions produced are accelerated toward the substrate assembly. When the ions reach the substrate assembly, they combine chemically with the substrate assembly to form volatile compounds that are readily driven off of the substrate assembly. In some cases, the mechanical impact of the ions with the substrate assembly also serves to etch the substrate. Because of the acceleration of the ions toward the substrate assembly, etching is anisotropic and proceeds rapidly on surfaces that are perpendicular to the propagation direction of the ions.

Unfortunately, dry etching with a plasma has significant limitations. While plasmas etch anisotropically, a plasma etches both the substrate assembly and the photoresist that defines the features to be produced. As a result, the total etching time is limited by the time required for the plasma etch to penetrate the photoresist. When the photoresist is penetrated, further etching is no longer limited to the intended substrate locations, but occurs in all substrate areas that are not protected by the photoresist. Photoresists typically etch four to five times more slowly than typical substrate materials to be etched (such as silicon or silicon oxide). Etching processes in which a substrate material is etched at a rate of less than about eight times the rate at which a resist etches are referred to herein as "resist-consuming."

Etching deep HAR features requires thick layers of photoresist to permit long etch times and such thick layers complicate the photolithographic patterning process. For example, to etch a HAR feature 3000 nm deep requires a photoresist thickness of as much 750 nm. Patterning a feature as small as about 250 nm is very difficult in such a thick layer of photoresist.

Other factors limiting plasma etching include the difficulty of providing a selected distribution of ions (charged particles) and neutral particles at the substrate surface and at the bottom of a feature being etched. Accordingly, improved etching methods are needed, especially for etching high aspect ratio features. A resist layer has a nominal thickness and a facet thickness, either or both of which are maintained, preserved, or increased in the disclosed methods and apparatus.

SUMMARY OF THE INVENTION

Methods and apparatus for etching substrate assemblies are disclosed in which a surface of a substrate assembly is etched while a thickness of a resist layer increases, remains constant, or decreases much more slowly than in a conventional etching process.

In a representative embodiment, the substrate assembly is exposed to a plasma made in a selected gas, which may be a gas mixture, at a selected flow rate. The gas and flow rate are selected by exposing a resist layer to the plasma formed in the gas and determining a range of flow rates for which the thickness of the resist layer, including any material deposited on the resist layer by the plasma, increases, remains constant or decreases more slowly than in known approaches. The etching rate of the selected gas is then measured for this range of flow rates on a surface of a substrate assembly. A flow rate is then selected for etching the surface of the substrate assembly for which the resist thickness increases or otherwise changes in the desired manner while a surface is etched.

In an alternative embodiment, the flow rate is selected so that the resist is etched much more slowly (for example ten to twenty times) more slowly than the surface of the substrate assembly. In some embodiments, the substrate assembly includes a silicon oxide layer that is etched with the selected gas at the selected flow rate.

A method of plasma etching is provided in which a high aspect ratio feature is etched into a surface of a substrate assembly while a resist layer covering a portion of the surface thickens, remains a constant thickness, or thins by less than about 25 nm. In addition, the method may provide a controlled etch profile so that the sides of the etched feature have taper or undercut angles of less than about ten degrees and, more specifically, in one approach less than about five degrees.

A method of anisotropically etching a substrate assembly is provided that comprises forming a resist layer on a surface of a substrate assembly and defining patterns in the resist layer by removing portions of the resist layer. The resist layer and the surface of the substrate are exposed to a plasma etch. In one specific approach, an exposed portion of the surface of the substrate assembly is etched by the plasma while the plasma increases the thickness of the resist layer. In another representative embodiment, the surface of the substrate assembly is exposed to a plasma generated in a gas consisting essentially of a fluorinated, chlorinated, or hydrogenated hydrocarbon gas or a mixture thereof. In additional embodiments, the thickness of the resist layer formed on the substrate assembly is less than about 600 nm. In a further embodiment, the resist layer has a thickness of d, and a high aspect ratio feature is etched into the substrate assembly to a depth D such that D/d>10.

Etched substrate assemblies are disclosed that may include an etched feature having an aspect ratio of at least 10:1 or higher, such as at least 20:1.

In additional embodiments, the substrate assembly includes a silicon oxide layer formed on a silicon wafer and the etched feature is etched into the silicon oxide layer.

In another method, a feature is etched into a substrate assembly by forming a resist layer on a surface of the substrate assembly and defining a feature on the surface by patterning the resist layer by removing the resist layer from at least a portion of the substrate assembly. The portion of the substrate assembly that is not covered by the resist layer is etched with a plasma generated in a flow of a first halogenated hydrocarbon containing gas or gas mixture. Simultaneously with the etching of the substrate assembly, the plasma increases the thickness of the resist layer and the feature is etched to have an aspect ratio of at least 10:1. In a further embodiment, one or more subsequent or prior etches, including a resist-consuming etch, may be performed to etch the portion of the substrate assembly that is not covered by the resist.

In another embodiment, a method of etching a high aspect ratio feature having a controlled profile is provided. The method includes the steps of selecting a substrate assembly and selecting a surface of the substrate assembly to be etched. A depth D and width d of a high aspect ratio feature are selected, for example such that D/d>10. In this example, a resist layer of thickness less than about D/5 is formed on the selected surface of the substrate assembly. The high aspect ratio feature is then etched into the selected surface of the substrate assembly with a controlled profile. In one embodiment, the substrate assembly is a silicon wafer with a layer of silicon oxide. In other embodiments, the thickness of the resist layer is selected to be less than about D/7.5, D/10, or D/15.

In another embodiment, a resist layer having a nominal thickness is deposited on a surface of a substrate assembly and patterned by removing selected portions of the resist layer, exposing a portion of the surface of the substrate assembly. The substrate assembly is etched to a depth of at least five times the nominal thickness at the exposed portion of the surface.

An etched substrate assembly is disclosed that comprises a selected surface and a feature etched into the selected surface to a depth D and width w, wherein D/w is greater than about 10. The substrate assembly may include a resist layer covering the surface except at the high aspect ratio feature, the resist layer having a thickness d, wherein d/D is greater than about 1/10.

The invention is directed to novel and non-obvious aspects of this disclosure, both individually and in combination as set forth in the claims below.

BRIEF DESCRIPTION OF THE DRAWINGS

FIG. 1A is a sectional view of an ideal high aspect ratio feature etched into a substrate assembly.

FIG. 1B is a sectional view of a high aspect ratio feature etched into a substrate assembly illustrating a taper with a local bow.

FIG. 1C is a sectional view of a high aspect ratio feature etched into a substrate assembly illustrating a taper with a barrel-shaped bow.

FIG. 1D is a sectional view of a high aspect ratio feature etched into a substrate assembly illustrating undercut.

FIG. 3A is a plan view of a portion of the substrate assembly of FIG. 2 prior to etching.

FIG. 3B is a sectional view of a portion of the substrate assembly of FIG. 2 prior to etching.

FIG. 3C is a sectional view of a portion of the substrate assembly of FIG. 2 after etching.

DETAILED DESCRIPTION

Figure 2:
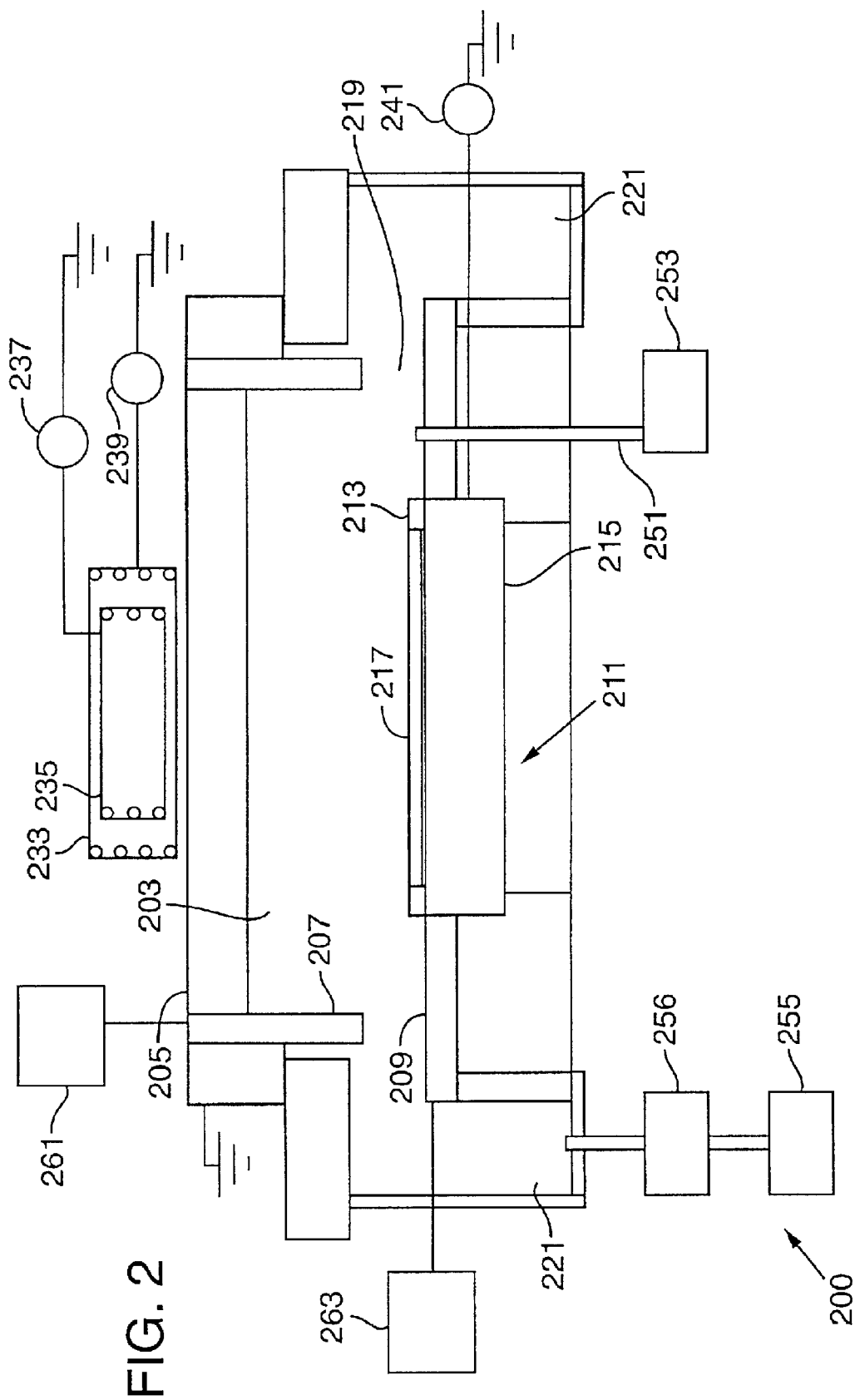
FIG. 2 is a sectional view of one example of a plasma etcher for etching a substrate assembly.

Methods, apparatus, and etched substrate assemblies are disclosed. In semiconductor manufacturing, a common starting material is a silicon wafer that is either doped or undoped. For some semiconductor devices, other wafer materials are used such as GaAs and InP. During device manufacturing, layers of various materials are applied to a surface of the wafer and circuit features are defined on the wafer. As used herein, a substrate assembly refers to a semiconductor wafer including any features or layers formed on the wafer.

The methods and apparatus disclosed are suitable for etching so-called high-aspect ratio ("HAR") features as well as other features. As used herein, a high aspect ratio feature is a feature having a depth to width ratio of at least 5:1, wherein a depth is a dimension of a feature measured in a direction perpendicular to the etched surface of the substrate assembly and a width is a dimension of a feature measured in a direction parallel to the etched surface. In approaches described below, extremely high aspect ratios are achievable, such as at least 10:1 and higher, such as at least 20:1.

FIGS. 1A–1D are sectional views (not to scale) of HAR features etched into a surface 22 of a substrate assembly 21. Referring to FIG. 1A, an ideal HAR feature 23 has an end surface 25 and side walls 27; the side walls 27 are perpendicular to the end surface 25 and to the surface 22 of the substrate assembly 21. In practice, HAR features tend to differ from this ideal shape. Referring to FIG. 1B, a HAR feature 33 etched in the substrate assembly 21 has a side wall 37 and an end surface 35. The side wall 37 is not perpendicular to the surface 22 or the end surface 35. The side wall 37 is an example of taper. At the end surface 35 the side wall 37 is tilted with respect to a line 40 that is perpendicular to the surface 22 at a taper angle A. Taper is typically associated with a local bow 39. Referring to FIG. 1C, the HAR feature 33 is shown with a barrel-shaped bow 41. FIG. 1D shows a HAR feature 53 that is etched so that a side wall 57 is tilted with respect to a line 54 that is perpendicular to a surface 52 at an undercut angle B. For HAR features, the angles A, B are preferably less than about 10 degrees, and more preferably less than about 5 degrees. HAR features having taper angles or undercut angles less than a selected angle are referred to herein as controlled profile features. FIGS. 1A–1D illustrate HAR features but features with lesser aspect ratios also exhibit bow, undercut, and taper.

FIG. 2 is a cross-sectional schematic view of one form of a plasma etcher 200. The illustrated plasma etcher 200 includes a chamber 203 defined by an RF window 205, an enclosure 207, a hot ring 209, and a substrate assembly chuck 211. The substrate assembly chuck 211 includes a collar 213 and a ceramic base 215 to support a substrate assembly 217, such as a silicon wafer or other substrate assembly. Exhaust ports 219 are defined by gaps between the enclosure 207 and the hot ring 209, and connect to exhaust chambers 221. The RF window 205 and the hot ring 209 are maintained at selected temperatures with respective temperature controllers 261, 263. In a specific example, the temperatures of the RF window 205 and the hot ring 209 are typically maintained between 120–200 degrees Centigrade and 150–300 degrees Centigrade, respectively. The RF window 205 and the enclosure 207 may be made of either silicon (Si) or silicon carbide (SiC) or a combination thereof and the hot ring 209 and the collar 213 may be made of quartz and silicon respectively. Silicon, especially when heated, can remove or "getter" fluorine from the chamber 203 and thus can alter the composition of a fluorine containing gas mixture if included in the chamber 203.

In this etcher, a first set of induction coils 233 and a second set of induction coils 235 are coaxially placed in proximity to the RF window 205, with the second set 235 placed within the first set 233. RF generators 239, 237 connect to the first and second set of induction coils 233, 235, respectively. An RF bias generator 241 is provided that connects to the substrate assembly chuck 211. RF excitations (RF voltages or currents) from the RF generators 239, 237 are applied to the first and second sets of induction coils 233, 235, respectively, and produce oscillating electric and magnetic fields at the RF window 205. The RF window 205 and the chamber walls 207 in this example are grounded. Because the RF window 205 is at least partially electrically conducting, the RF window 205 shields the chamber 203 from the oscillating electric fields produced by the coils 233, 235. The oscillating electric fields are either attenuated by or, in some cases, totally blocked by the RF window 205. As a result of the shielding effect of the RF window 205, the oscillating magnetic field produced by the coils 233, 235 is primarily responsible for the generation of a plasma in the chamber 203. The RF generators 237, 239 in the illustrated etcher provide RF excitations at frequencies of between about 1.0–3.0 MHz at respective powers between about 400–1250 W and 500–1200 W. The RF bias 241 provides an RF power of between about 0–250 W to the substrate assembly chuck 211 at a frequency between about 1–3 MHz.

A gas inlet 251 is connected to a gas supply manifold 253. Gases, which may be gas mixtures, for the chamber 203 are mixed at the gas manifold 253 and supplied to the chamber 203 through a gas inlet 251. A vacuum pump 255 is situated to evacuate the chamber 203 and is connected to the chamber 203 via a valve 256. During etching, the pressure in the chamber may generally be maintained in the range of from about 2 mtorr to 50 mtorr.

One specific etcher of the type shown in FIG. 2 is an IPS Dielectric Etcher from Applied Materials, Inc., of Santa Clara, Calif.

FIGS. 3A–3B show the substrate assembly 217 prior to etching. The substrate assembly 217 may be a silicon wafer 217b covered with a silicon oxide layer 217a. The silicon wafer 217b typically has a thickness of less than 1–2 mm and a diameter of 50–600 mm and can be doped or undoped. The silicon oxide layer 217a can be formed in different ways mich as, for example, deposited from a gas such as tetraethyoxysilane (TEOS) or thermally grown (thermal oxide).

The oxide layer 217a is coated with a patterned resist layer 301, the resist layer having a nominal thickness $t_N$. Apertures 303, 305 are provided in the resist layer 301 to permit substrate etching. Although fabrication processes attempt to maintain planarity of the substrate assembly 217, the substrate assembly 217 generally has one or more high regions such as the region 307. At the region 307, the thickness of the resist layer 301 is less than the nominal thickness $t_N$. When situated on the substrate assembly chuck 211, the oxide layer 217a and the resist layer 301 are exposed to the plasma in the chamber 203. The resist layer 301 can be made of any suitable resist material, including photoresists, deep ultraviolet resists, X-ray resists, electron beam resists, I-line resists, and multilayer resists. The selected resist material can be deposited by spin coating or any other suitable method, and patterned with conventional photolithographic or other patterning process, such as X-ray, I-line, and election beam lithography.

Conventional plasma etching etches the resist layer 301 as well as the silicon oxide layer 217a. The rate at which the resist layer 301 etches is generally slower than the rate at which the silicon oxide layer 217a etches. The ratio of the etch rate of a substrate assembly layer such as the silicon oxide layer 217a to the etch rate of the resist layer 301, referred to herein as etch "selectivity," is less than 8:1, and is typically less than about 5:1. The term "resist-consuming" approach refers to an approach wherein the selectivity is less than 8:1. Because both the resist layer 301 and silicon oxide (substrate) layer 217a etch in a conventional approach, production of a HAR feature in a conventional approach requires a resist layer thick enough so that the resist layer is not etched through before the HAR feature is etched to the required depth. The use of thick layers of resist in conventional etching complicates the deposition of the resist layer and especially the lithographic patterning of the resist layer. In addition, the limited selectivity reduces the aspect ratio which is achievable.

Surprisingly, these disadvantages of conventional etching are overcome by the approach disclosed herein. For example, by selectively adjusting a flow rate of a gas or gas mixture in the chamber 203, the rate at which resist material is etched significantly decreases. Even more surprisingly, in some embodiments of this approach, the nominal thickness $t_N$ of the resist layer does not change significantly during etching. Thus, the nominal resist thickness $t_N$ increases, stabilizes, or slowly decreases, providing selectivities of greater than 10:1, 100:1, or larger, while still permitting etching with a controlled profile. Although not limited to a specific theory of operation, the changes in the etch rate of the resist may be attributable to plasma deposition of additional material on the resist layer 301, chemical reactions induced by the plasma in the resist layer 301 so that constituents of the gas mixture are incorporated into the resist, or chemical reactions of the resist layer 301 with the plasma. As used herein, an etch process in which a resist thickness is increased is a "resist-enhancing" process and an etch process in which an etch rate of a resist is less than about one-tenth that of a substrate material is a "resist-conserving" process.

Because the nominal resist thickness $t_N$ increases, stabilizes, or decreases more slowly than in a "resist-consuming" etching process, substrate assemblies having surfaces that have ideal planarity as well as those which deviate from planarity are more readily etched. To etch nonplanar surfaces, the nominal thickness $t_N$ of the resist layer is selected to protect high regions such as the region 307 until etching is complete. The resist layer 301 is then thicker in planar regions of the substrate assembly 217 in order to protect the region 307. With the resist-conserving or resist-enhancing processes described herein, a thinner nominal thickness can be applied and is sufficient to protect the substrate assembly, even at higher regions such as the region 307. Subsequent photolithographic steps are simpler because patterns to be etched can be better focused in a thin resist layer than a thick layer. For thick resist layers, precise focusing during photolithography is important. For thin resist layers, larger focus errors are more readily tolerated.

FIG. 3C shows the substrate assembly 217 after partial etching. As is apparent from FIG. 3C, the resist layer 301 is etched and the nominal thickness $t_N$ of the resist layer 301 is changed. A facet region is a region at the edge of a feature. The thickness of the resist at the facet may be the same as the nominal thickness. Alternatively, the resist at the facet may differ from the nominal thickness, for example, be thinner as a result of etching. In FIG. 3C, a facet region 313 of the resist layer 301 is shown etched so that the nominal thickness $t_N$ is not the same as a facet thickness $t_F$. The facet thickness $t_F$ is particularly important for etching high resolution features. Once the resist layer 301 is removed so that the facet thickness $t_F$ is zero, the etched feature size is no longer controlled by the resist layer 301. In the resist-conserving and resist-enhancing methods and apparatus disclosed herein, the facet thickness $t_F$ changes more slowly, stabilizes, or increases during etching. Thus, etch processes can be resist-enhancing or resist-conserving with respect to facet thickness $t_F$, nominal thickness $t_N$, or both. As used herein, the phrase "resist layer thickness" means nominal thickness $t_N$, facet thickness $t_F$, or both.

In one example, by etching with a selected gas flow rate, the resist layer thickness increases or remains constant during etching, or is etched very much more slowly than in conventional plasma etching. In some cases, the resist layer is thicker after etching than it was initially, i.e., the etching process is resist-enhancing. In some cases, the resist layer thins slightly (by no more than about 25–50 nm) at the start of etching and then the resist layer thickness either stabilizes, begins to increase, or decreases more slowly than in a resist-consuming process. The initial thinning of the resist is referred to as "start-up loss." The composition of the added material is a function of the resist material, the gas used to generate the plasma, or both. Using a plasma generated in a fluorinated hydrocarbon gas, the increased or stabilized thickness may result from incorporation of additional fluorine into the resist or deposition of a fluorinated material on the resist.

Maintaining the selected gas flow rate permits etching of a substrate material to proceed while the resist thickens. Note that the resist-enhancing etch process disclosed herein differs from conventional chemical vapor deposition (CVD) in that etching and thickening occur simultaneously and that there is no thickening (or deposition) at surfaces that are unprotected by resist.

For the etching system 200 of FIG. 2, the powers provided to the source and the bias can be selected in conjunction with a flowrate to provide a resist-enhancing or a resist-conserving process. Generally low powers are preferred, but for selected power levels, the flowrate can be adjusted to provide a resist-enhancing or resist-conserving process. In addition, higher selectivity processes are associated with slower etch rates and for a particular application, etch selectivity can be selected in conjunction with etch rate. For example, if high throughput is intended, the lowest selectivity consistent with the thickness (either facet thickness or nominal thickness) of the resist layer 301 can be selected.

Figure 4A:
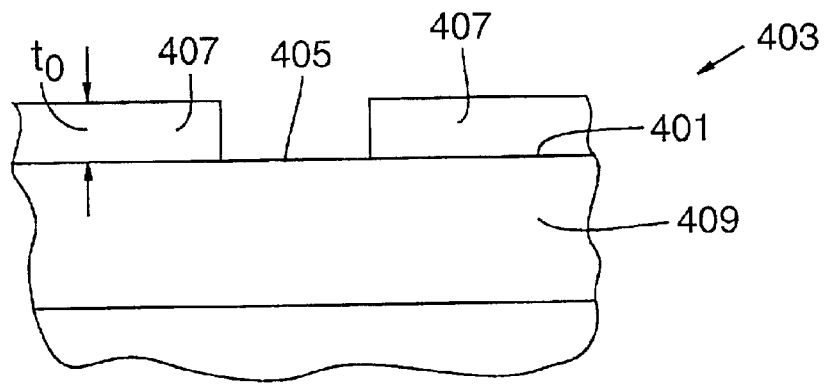
FIG. 4A is a sectional view of a substrate assembly coated with a patterned resist.
Figure 4B:
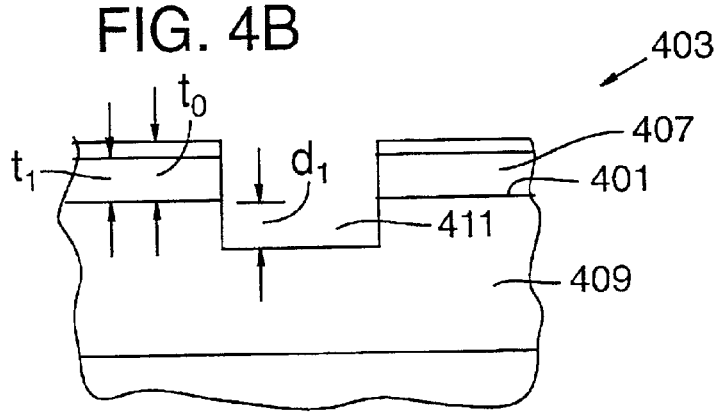
FIG. 4B is a sectional view of the substrate assembly of FIG. 4A after etching.
Figure 4C:
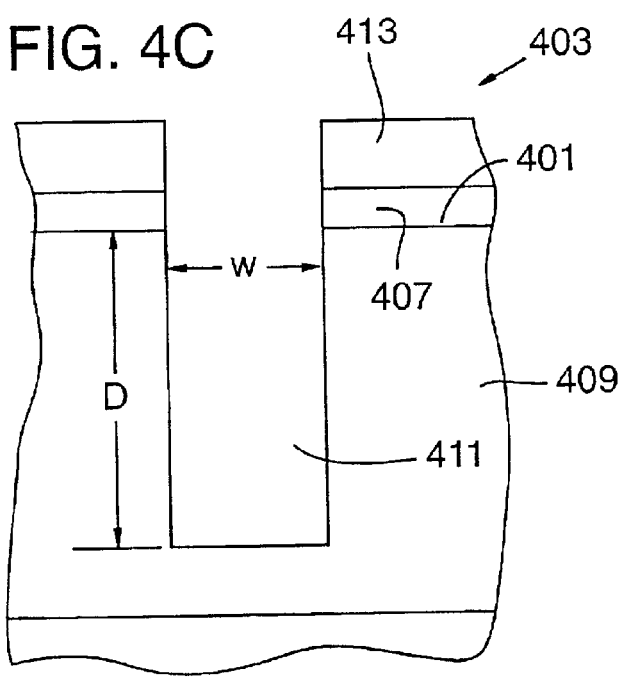
FIG. 4C is a sectional view of the substrate assembly of FIG. 4B after additional etching.

FIGS. 4A–4C are cross-sectional views of a substrate assembly 403 illustrating a resist-enhancing process. Referring to FIG. 4A, a resist layer 407 covers a surface 401 of an oxide layer 409 of the substrate assembly 403 except in a representative exposed region 405 that is defined in the resist layer 407 using a lithographic or other process. Before etching begins, the initial thickness to of the resist layer 407 is in the range of 25 nm to 2,000 nm, or preferably in the range of between about 25 nm to 1,500 nm, or still more preferably in the range of between about 50 nm and 1,000 nm. The substrate assembly 403 is then exposed to the etch and a trench 411 (or other feature) is etched into the oxide layer 409 to an initial depth $d_1$. During etching, the resist layer 407 thins to an etched resist thickness $t_1$ that is slightly smaller than the initial resist thickness $t_0$ as illustrated in FIG. 4B. Etching of the wafer 403 continues and a layer 413 of material from the etching process is deposited on the resist layer 407, or alternatively, the thickness of the resist layer 407 increases by a thickness corresponding to the thickness of the layer 413 by another mechanism. The additional thickness of the layer 413 that is added to the thickness of the resist layer 407 after the initial thinning of the resist layer 407 continues to increase as the trench 411 becomes deeper. As shown in FIG. 4C, the combined thickness of the resist layer 407 and the layer 413 is greater than the thickness to of the resist layer 407 before etching. (The sum of the thickness of the resist layer 407 and the layer 413 is referred to as the combined thickness.) As shown in FIG. 4C, the aspect ratio of the trench 411 is the ratio of the final depth D to the width W. For convenience, only a single resist thickness is shown in FIGS. 4A–4C, but the resist-enhancing process is configurable to enhance either the nominal thickness $t_N$ or the facet thickness $t_F$, or both.

In a representative example, the initial nominal thickness $t_N$ and facet thickness $t_F$ of the resist layer 407 is about 750 nm and the nominal (etched) resist thickness $t_1$ is about 710 nm after etching for about 80 sec (i.e., the start-up loss is 40 nm). During this same 80 sec., the facet thickness $t_F$ decreases to about 600 nm and the trench 411 is etched to an initial depth $d_1$ of about 100 nm. Etching for an additional 80 sec. increases the nominal thickness $t_N$ of the resist layer 407 and the layer 413 to a final combined nominal thickness $t_F$ of about 800 nm and a final etch depth of about 1,842 nm. After this same 80 sec. of additional etching, the facet thickness $t_F$ remains about 600 nm. During the last 80 sec., the selectivity of etching of the nominal thickness $t_N$ is undefined because the nominal thickness increases. The selectivity of etching of the facet thickness $t_N$ is infinite because the facet thickness is unchanged. Etch conditions for performing this etch with the plasma etcher 200 of FIG. 2 are listed in Table 1.

TABLE 1

| | |
|---|---|
| RF power to coils 233 | 725 W |
| RF power to coils 235 | 125 W |
| RF bias to substrate stage 211 | 700 W |
| Temperature of hot ring 209 | 200 C |
| Temperature of RE window 205 and enclosure 207 | 140 C |
| Temperature of substrate stage | −10 C |
| Etch gas | CH2F2 |
| Gas flow rate | 40 sccm |
| He backside pressure | 20 Torr |
| Chamber pressure | 20 mTorr |

In specific examples, the etch depths available by simultaneously etching the oxide layer 409 and thickening the resist layer 407 have been achieved to depths corresponding to aspect ratios of about 10:1 For example, for a 0.25 µm wide feature, etching has been achieved to depths of about 2.5 µm. With deeper etching, some undercut or taper in the etched features has been observed. However, the use of a resist-enhancing or resist-conserving process following or preceded by a conventional (resist-consuming) process can result in features with higher aspect ratios and a controlled etch profile. In addition, using a resist-enhancing (or resist-conserving process) in conjunction with a conventional resist-consuming process permits the use of thinner resist layers, simplifying other substrate processing steps.

As another example, consider etching a HAR feature of width of 250 nm to a depth of 2,500 nm in an oxide layer (a 10:1 aspect ratio). Using the resist-conserving process, a resist layer of thickness 200 nm (an arbitrary minimum thickness) plus an additional 12.5 nm of resist (to compensate for the slight initial etch of the resist process), or a total resist thickness of 212.5 nm is satisfactory. Lesser resist thicknesses are also satisfactory. In comparison, a conventional resist-consuming process typically etches oxide four times faster than resist, so that a resist thickness of 200 nm plus 2500/4 nm is required, or a total resist thickness of 825 nm. Thus, with the resist-enhancing or resist-conserving process of this example, the resist layer can be 612.5 nm thinner than in the conventional approach. Defining a pattern corresponding to a 250 nm feature width in an 825 nm resist thickness is impractical and may be unachievable because of small dose and focus latitude. Therefore, the etching/thickening (resist-enhancing) process permits etching of an extremely broad range of HAR features.

The resist-enhancing and resist-conserving processes of the above specific example may be used to, for example, etch a feature with a controlled profile only to a first depth. Little or no resist is consumed by this first etch and, in some cases, the resist thickness increases (i.e., the combined thickness of the resist layer and the newly deposited material is greater than the original resist thickness $t_0$). Therefore, after the first etch by such a resist-enhancing or resist-conserving process, additional etching steps can be performed, such as using conventional etches that consume significant resist. The total etch depth available is the sum of the etch depth available with the conventional (resist-consuming) etch and the etch depth available with the resist-enhancing or resist-conserving process. The aspect ratio achievable is the sum of the aspect ratios available in each of these processes independently. For example, in a resist-conserving process having about 800 nm of combined thickness after etching by this process to a depth of 2.5 µm, a conventional etch having a selectivity of 5 can be used to etch up to, for example, 4.0 µm deeper, if process conditions permit all the resist to be removed. (Typically 50–100 nm of resist remain when etching is complete so that small process variations do not lead to unusable etched parts.) In this specific example, the result of the combined etching processes is a controlled profile feature with a depth of 6.5 µm and a width of 0.25 µm, or an aspect ratio of 25:1. If the etch rate of the conventional resist-consuming process decreases as the etched depth increases as is typical of many resist-consuming etches, then the achievable aspect ratio is smaller. In this example, the resist-enhancing and resist-conserving process is followed by a conventional resist-consuming process, but the resist-conserving process could be performed first, or the processes could be applied alternately.

In the representative example discussed above, an oxide coated substrate is etched in a plasma generated with $CH_2F_2$ gas. Other suitable gases include halogenated hydrocarbons, including iodinated, chlorinated, and fluorinated hydrocarbons, including $CF_4$, $CHF_3$, $CH_3F$, $C_2F_6$, $C_2HF_5$, $C_3F_8$, $C_4F_8$, $C_4F_6$, and $C_5F_8$, and mixtures of these gases, as well as mixtures of these gases with the noble gases and hydrogen. Other substrate assembly layers can be selected as well. For example, a polysilicon layer can be etched with a plasma formed by a chlorinated hydrocarbon gas.

If a resist-enhancing or resist-conserving process is to be achieved by varying gas and gas flow rate, the gas and gas flow rate for etching a particular layer material are selected as follows. A substrate coated with a resist is exposed to a plasma obtained with a selected gas, and the deposition of material on the substrate or other thickening of the resist as a function of gas flow rate is measured. If the selected gas does not thicken the resist at any flow rate, another gas is selected. (In some cases, the resist is initially thinned during the etching process and then begins to increase in thickness and gas selection can include a determination of etch rate as a function of etching time to detect this initial thinning.) This is repeated until a gas is identified for which the plasma increases the resist thickness on the substrate. Then the etch rate as a function of gas flow rate is measured, varying the gas flow rate only in the range for which thickening is possible. Using these measurements, a preferred flow rate for the gas is selected. In addition, the gas flow rates and RF excitation powers can be selected in view of etch uniformity and etch rate. Higher gas pressures generally provide higher etch rates. The selection of gas and gas flow rate is typically specific to a particular type of plasma etcher and is repeated for different plasma etchers.

Although the gas and the gas flow rate are significant parameters for the resist-enhancing and resist-conserving processes, other parameters can be varied as well. In most plasma etchers, RF power levels, chamber pressure, and chamber temperature can be adjusted to improve these processes.

While the invention is described with respect to particular implementations, the invention is not limited to these implementations.

We claim:

1. A method of manufacturing, comprising:
    patterning a resist layer on a substrate assembly so that portions of the substrate assembly are exposed;
    etching the exposed portions of the substrate assembly with a resist-conserving etch; and
    etching the exposed portions of the substrate assembly with a resist-consuming etch.

2. A method of anisotropically etching a substrate assembly, comprising:
    forming a resist layer on a surface of the substrate assembly, the resist layer having a thickness;
    defining patterns in the resist layer by removing portions of the resist layer; and
    exposing the resist layer and the surface of the substrate assembly to a plasma generated in a gas mixture consisting essentially of a chlorinated hydrocarbon gas and simultaneously etching a portion of the substrate exposed by the step of removing portions of the resist layer and increasing the thickness of the resist layer with the plasma.

3. A method of plasma etching a surface of a substrate assembly, comprising:
    forming a layer of a resist on the surface of the substrate assembly, the resist layer having a nominal thickness $t_N$;

patterning the resist by removing selected portions of the resist to expose corresponding portions of the surface of the substrate assembly;

exposing the resist layer and the exposed portions of the surface of the substrate assembly to a resist-conserving etch; and exposing the resist layer and the exposed portions of the surface of the substrate assembly to a resist-consuming etch.

4. The method of claim 3, wherein the exposed portions of the substrate assembly are etched to a depth of at least $5t_N$.

5. The method of claim 3, wherein the exposed portions of the substrate assembly are etched to a depth of at least $10t_N$.

6. The method of claim 3, wherein the resist-conserving etch has a start-up loss and the nominal thickness $t_N$ of the resist layer is less than twenty times the start-up loss.

7. A method of plasma etching a surface of a substrate assembly having patterns defined by a resist layer, comprising:

enclosing the substrate assembly in a silicon or silicon carbide enclosure;

selecting a surface of the substrate assembly to be etched;

selecting a gas or gas mixture;

adjusting a flow rate of the gas or gas mixture into the chamber so that the resist layer etches at a rate that is at least 10 times slower than the etch rate of the selected surface;

exposing the substrate assembly to a gas flow; and generating a plasma in the gas flow with an applied magnetic field.

8. A method of anisotropically etching a substrate assembly, comprising:

forming a resist layer on a surface of the substrate assembly, the resist layer having a thickness;

defining patterns in the resist layer by removing portions of the resist layer;

exposing the resist layer and the surface of the substrate assembly to a first plasma etch and simultaneously etching a portion of the substrate exposed by the step of removing portions of the resist layer and increasing the thickness of the resist layer with the plasma etch; and exposing the resist layer and the surface of the substrate assembly to a second plasma etch and simultaneously etching a portion of the substrate exposed by the step of removing portions of the resist layer and decreasing the thickness of the resist layer with the second plasma etch.

9. The method of claim 8, wherein the step of simultaneously etching a portion of the substrate assembly and increasing the thickness of the resist layer is performed by exposing the surface of the substrate assembly to a plasma generated in a gas mixture consisting essentially of a fluorinated, chlorinated, or hydrogenated hydrocarbon gas.

10. The method of claim 9, wherein the first plasma is generated in a gas mixture consists essentially of at least one of the gases CF4, CHF3, CH2F2, CH3F, C2F6, C2HF5, C3F8, C4F8, C4F6, and C5F8.

11. The method of claim 9, wherein the gas mixture consists essentially of CH2F2.

12. The method of claim 8, wherein the thickness of the resist layer is less than about 600 nm.

13. The method of claim 8, wherein the resist layer has a thickness d, and a high aspect ratio feature is etched into the substrate to a depth D such that D/d>5.

14. The method of claim 8, wherein the thickness of the resist layer is a facet thickness and the first plasma etch increases the facet thickness.

15. The method of claim 8, wherein the thickness of the resist layer is a nominal thickness and the first plasma etch increases the nominal thickness.

16. A method for plasma etching an oxide layer formed on a silicon wafer, the oxide layer partially covered with a patterned layer of a resist, the method comprising:

exposing the oxide layer and the patterned layer of resist to a first gas consisting essentially of CH2F2;

generating a plasma within the first gas;

directing ions from the plasma onto exposed portions of the oxide layer;

adjusting the flow of the first gas so that the exposed portions of the oxide layer are etched such that the oxide layer is etched at a rate at least five times faster than the resist; and etching the portion of the substrate assembly that is not covered by the resist with a plasma generated in a flow of a second halogenated hydrocarbon containing a second gas that etches the surface of the substrate and the resist layer.

17. The method of claim 16, wherein the patterned layer of resist has a nominal thickness and the gas flow of the first gas is adjusted so that the nominal thickness decreases at a rate that is at least ten times slower than the rate at which the oxide layer is etched.

18. A method of etching a substrate assembly, comprising:

forming a resist layer on a surface of the substrate assembly;

defining a feature on the surface of the substrate assembly by patterning the resist layer so that the resist layer is removed from at least a portion of the substrate;

etching the portion of the substrate that is not covered by the resist layer and depositing a material on the resist layer with a first plasma generated in a flow of a first halogenated hydrocarbon containing gas so that the etched feature has an aspect ratio of at least 5:1; and etching the portion of the substrate assembly that is not covered by the resist with a second plasma generated in a flow of a second halogenated hydrocarbon containing gas that etches the surface of the substrate and the resist layer.

19. The method of claim 18, wherein the etched feature has an aspect ratio of at least 10:1.

20. The method of claim 18, wherein the patterned layer of resist has a facet thickness and the step of etching the substrate with the first plasma is resist-conserving with respect to the facet thickness.

21. The method of claim 18, wherein the portion of the surface exposed to the first plasma and the second plasma is etched so that the etched feature has an aspect ratio of at least 10:1.

22. The method of claim 18, further comprising forming an oxide layer on the surface of the substrate assembly, forming the resist layer on the oxide layer, and patterning the resist to expose a portion of the oxide layer.

23. A method of etching a substrate assembly, comprising:

selecting a gas or gas mixture;

providing a predetermined flow rate of the gas or gas mixture to an enclosure at a predetermined pressure;

maintaining the temperature of the enclosure at about 140 C;

patterning a surface of the substrate assembly with a resist;

situating the substrate assembly inside the enclosure;

heating or cooling the substrate assembly to achieve a substrate assembly temperature of about −10 C;

providing a silicon getter at a temperature of about 200 C within the enclosure;

producing a plasma in the gas or gas mixture in the enclosure with an applied radio-frequency excitation at a frequency of between 1 and 3 MHz;

exposing the substrate assembly to the plasma; and etching the surface of the substrate assembly at a rate that is at least 10 time greater than a rate at which the resist etches.

* * * * *

UNITED STATES PATENT AND TRADEMARK OFFICE
CERTIFICATE OF CORRECTION

PATENT NO. : 6,784,111 B2
DATED : August 31, 2004
INVENTOR(S) : Donohoe et al.

It is certified that error appears in the above-identified patent and that said Letters Patent is hereby corrected as shown below:

Column 6,
Line 18, "election" should read -- electron --.

Column 8,
Lines 8 and 26, "to" should read -- $t_0$ --.
Line 38, "sec" should read -- sec. --.
Line 49, "$t_N$" should read -- $t_F$ --.
Line 58, "RE" should read -- RF --.

Column 9,
Line 2, "10:1" should read -- 10:1. --.

Column 11,
Line 58, "consists" should read -- consisting --.

Signed and Sealed this

Fourth Day of April, 2006

JON W. DUDAS
*Director of the United States Patent and Trademark Office*